(12) United States Patent
Divakar et al.

(10) Patent No.: US 10,734,302 B2
(45) Date of Patent: Aug. 4, 2020

(54) METHOD AND APPARATUS OF OPERATING A COMPRESSIBLE THERMAL INTERFACE

(71) Applicant: KULR TECHNOLOGY CORPORATION, Campbell, CA (US)

(72) Inventors: Mysore Purushotham Divakar, San Jose, CA (US); Juergen Mueller, San Diego, CA (US); Michael Mo, Saratoga, CA (US)

(73) Assignee: KULR TECHNOLOGY CORPORATION, Campbell, CA (US)

( * ) Notice: Subject to any disclaimer, the term of this patent is extended or adjusted under 35 U.S.C. 154(b) by 17 days.

(21) Appl. No.: 16/247,476

(22) Filed: Jan. 14, 2019

(65) Prior Publication Data

US 2019/0221495 A1    Jul. 18, 2019

Related U.S. Application Data

(60) Provisional application No. 62/617,047, filed on Jan. 12, 2018, provisional application No. 62/647,539, filed on Mar. 23, 2018.

(51) Int. Cl.
*H01L 23/373* (2006.01)
*F28F 21/02* (2006.01)
*H01L 23/552* (2006.01)
*H01L 23/42* (2006.01)

(52) U.S. Cl.
CPC .......... *H01L 23/3733* (2013.01); *F28F 21/02* (2013.01); *H01L 23/3737* (2013.01); *H01L 23/42* (2013.01); *H01L 23/552* (2013.01)

(58) Field of Classification Search
CPC .. H01L 23/3733; H01L 23/42; H01L 23/3737
See application file for complete search history.

(56) References Cited

U.S. PATENT DOCUMENTS

| 5,776,609 | A | 7/1998 | McCullough | |
|---|---|---|---|---|
| 8,785,026 | B2 | 7/2014 | Hu et al. | |
| 9,873,774 | B1 * | 1/2018 | Kuczynski | C08K 3/22 |
| 2005/0284789 | A1 | 12/2005 | Carespodi | |
| 2009/0146292 | A1 * | 6/2009 | Drake | H01L 23/3733 |
| | | | | 257/712 |
| 2010/0028758 | A1 | 2/2010 | Eaves et al. | |
| 2012/0325439 | A1 | 12/2012 | Altman et al. | |
| 2014/0264799 | A1 * | 9/2014 | Gowda | H01L 23/3677 |
| | | | | 257/701 |
| 2014/0315075 | A1 | 10/2014 | Bilek et al. | |
| 2015/0064514 | A1 | 3/2015 | Wu et al. | |
| 2017/0012260 | A1 | 1/2017 | Knowles et al. | |
| 2018/0254236 | A1 * | 9/2018 | Cola | H05K 7/20481 |

* cited by examiner

*Primary Examiner* — Selim U Ahmed
*Assistant Examiner* — Evan G Clinton
(74) *Attorney, Agent, or Firm* — Venture Pacific Law, PC

(57) ABSTRACT

A thermal electrical (TE) interface comprises a primary fiber thermal interface (FTI) having a first side configured to contact a heatsink, and a second side. The primary fiber thermal interface has a thickness ranging from 0.3 mm to 4 mm. A secondary fiber thermal interface (FTI) has a first side configured to contact the second side of the primary FTI, a second side configured to contact circuit components to dissipate heat from the circuit components through the first side of the primary FTI. The secondary fiber thermal interface has a thickness equal to or greater than the primary FTI.

10 Claims, 19 Drawing Sheets

METHOD AND APPARATUS OF OPERATING A COMPRESSIBLE THERMAL INTERFACE

CROSS REFERENCE

This application claims priority from provisional patent applications entitled "Compressible Thermal Interface" filed on Jan. 12, 2018, and having application No. 62/617,047, and "Skyline TIM and Compressible FTI" filed on Mar. 23, 2018, and having application No. 62/647,539. Said applications and any other referenced application are incorporated herein by reference.

FIELD OF INVENTION

The present disclosure relates to thermal management for heat generating products and, in particular, to thermal protection of heat generating components in an assembly to prevent overheating of the components.

BACKGROUND

Thermal management in electronics products is one of the most challenging problems. As the electronic industry advances, electronic components are often more densely packed together and operate at higher frequencies which cause many of the electronic components to generate large amounts of heat. Some of the challenges include how to efficiently connect heat dissipating components to a heatsink that is most often located outside the enclosure and separated by large gaps or distances to fill. This problem is more acute in the case of passively cooled embedded, industrial and consumer computing which consist of single board computers (SBC) in the ETX, Mini-ITX, Micro-ATX, Nano-ITX, DIN Rail-mounted, industrial rackmount, COM Express, 3.5" ESB, PCI SBC, PC/104 & PC/104-Plus and many others. Similar problems also exist in many fanless Edge Computer nodes, home IoT Gateways and Smart Home Assistants such as Google Home, Amazon Echo, and Samsung Smartthings.

For example, many current fanless computers and devices address thermal management of heat dissipating components to the outside environment by providing thermal pathways as feasible using metal sheets and bars that connect to cases of the fanless computers and devices. However, in most instances, these thermal pathways connect circuit boards to the mounting locations of the computer case and do not include critical components such as CPUs.

Others have used large thickness thermal gap pads. Although there are some pads with thicknesses as large as 8 mm, their thermal conductivity is typically limited to 2 W/m-K or less and requires high pressure (above 50 psi) interface. W/m-K stands for Watts per meter-Kelvin or 'k Value'. The comparison of thermal conductivity can be measured by the 'k Value'. The 'k Value', or Thermal Conductivity, specifies the rate of heat transfer in any homogeneous material. Still others use form-in-place thermal compounds. These too suffer from very low thermal conductivity and are difficult to rework. The thermal compounds are also likely to damage components if the dispensing of the thermal compounds is not carefully managed. Throttling down the workloads of processors to reduce heat generation has been used at the expense of loss productivity. External forced air cooling has been used to actively cool SBC (single board computer) cases.

Current industry practices of filling air gaps, interfacing a heatsink with chip components have been limited to 5 mm as an upper bound using thermal interface materials (TIMs). FIG. 1 illustrates a case 10 for Raspberry Pi3 Model B. There are many examples of electronics hardware where different heights of components result in critical chip components like CPUs, memory modules (DIMMs) and solid storage drives (SDD) not adequately served. In the present example, as illustrated in FIG. 1, the case 10 for the Raspberry Pi3 Model B is separated by a gap 12 of over 24 mm.

Large gaps often leave heat-dissipating chip components and modules located inside the enclosure unserved by externally located heatsinks or forced air cooling. This shortcoming seriously limits the processing capability of end products and do not enable the products to realize their full operating potential.

In addition to interfacing across large gaps, an equally critical problem facing the electronic industry is thermally- and/or electrically-interfacing with heat dissipating components with those of flexible and curved surfaces. Currently, most thermal management materials are rigid and are not suitable to interface with non-flat surfaces. Of the available TIMs (thermal interface materials) that are flexible, thermal conductivity is quite low (below 2 W/m-K) and the pressure necessary to maintain desired contact exceeds 50 psi.

The problem is exasperated as advances in IC packaging methodology continue to evolve. For example, multiple chips arranged in a planar or stacked configuration with an interposer for communication known as 2.5D/3D SiP (System-in-Package) methodology can include multiple integrated circuits (like CPU SoC, ASIC, memory, analog, and passive components) inside a same package. Chips or packages may be stacked vertically, side-by-side horizontally, or tiled horizontally on a substrate and interconnected by wire bonds or solder bumps. The approach typically has been used for applications where performance and low power are critical. Communication between chips is accomplished using either a silicon or organic interposer, typically a chip or layer with through-silicon vias for inter-chip communication. While communication between chips is slower than on-chip communication, distances are shorter and there are more conduits for signals. Collectively, communication is faster, and less energy is required to drive those signals. In addition, distances can be shorter between chips than within a single planar die, and at advanced nodes, skinny wires in single-chip architectures can slow performance and increase resistance and capacitance.

FIG. 2 illustrates a prior art cut-away view of a 2.5D/3DIC SiP (Silicon Package) 20 mounted on a printed circuit board. The silicon package 20 is mounted on a portion of a printed circuit board 210. Package bumps 212, SiP substrate 214, and flip-chip bumps 216 provide an interface to a silicon interposer 218 that includes topside metal layers, interposer substrate, backside metal layers, and through-silicon vias (TSVs). The micro-bumps 220 provide an interface to Die #1 and Die #2.

FIG. 3 illustrates a prior art cut-away view of a 2.5D package 30 having a silicon interposer 330 with stacks of varying heights. The 2.5D package 30 is mounted on a portion of a printed circuit board 310. A SiP substrate 320 and silicon interposer 330 provide interfaces to Die #1, Die #2, Die #3, Die #4, Die #5, and Die #6 using package bumps, flip-chip bumps, micro-bumps, and though-silicon vias (TSVs) as discussed above and with respect to FIG. 2.

As shown in FIG. 3 and due to different various functions of the dice, there will be different die thicknesses affecting the height of the 2.5D package. Currently, most applications of heatsink interfaces use thermal interface materials (TIMs)

that make a contact onto a single contact surface. There are an increasing number of applications where a single TIM layer is expected to conform to the varying die heights from variances in flatness caused by reflow or package tilt acceptable by JEDEC standards. However, deviations from the standards have adverse consequences for TIMs. TIMs and many other interfacing materials are rigid and do not perform optimally if non-flat. Even for heatsinks interfacing with multiple packages of a same specified height, variations in manufacturing and assembly can result in relatively uneven surfaces from a TIM perspective. Given the variations and manufacturing tolerances on heights between die packages, non-bonded TIMs interfacing with heatsinks may be the best option. The non-bonded TIMs can accommodate variations in package heights as long as minimal pressure can be maintained for good contact resistance. Moreover, mechanical stress interaction between the packages from thermal cycling can be minimized using non-bonded TIMs.

Similarly, 3DIC SiP (System-in-Package) typically feature power dissipating components at the bottom of the stack. Memory components which are placed higher and can be subjected to thermal cross talk from heat dissipation of the bottom components. Depending on the package heights of a complex 2.5D/3DIC SiP. TIMs heights ranging from 50 um to 1 mm or more may be needed to efficiently interface heatsinks to the chip packages. Moreover, the foregoing challenges are further magnified in photonic packaging applications. Temperature fluctuations in photonic packaging can cause adverse wavelength shifts that have forced design engineers to look for innovative thermal management solutions.

Accordingly, there is a need to provide a thermal interface that overcomes the short comings of current thermal management techniques. A novel thermal management system, method, and apparatus of using unique TIMs to address heat dissipation of system component are provided.

DESCRIPTION OF THE DRAWINGS

The foregoing and other objects, aspects, and advantages of the present disclosure can be better understood from the following detailed description of various embodiments of the present disclosure when taken in conjunction with the accompanying drawings as follows.

DETAILED DESCRIPTION OF THE EMBODIMENTS

In the following detailed description of the embodiments, reference is made to the accompanying drawings, which form a part hereof, and in which is shown by way of illustration of specific embodiments in which the present disclosure may be practiced. It is appreciated that the terms "a" or "an," as used herein, are defined as one or more than one. Also, unless stated otherwise, terms such as "first", "second", "third", etc. are used to distinguish between elements such terms describe. These terms are not necessarily intended to indicate temporal or prioritization of such elements.

In an embodiment of a thermal electrical (TE) interface, the TE interface comprises a primary fiber thermal interface (FTI) having a first side configured to contact a heatsink, and a second side, the primary fiber thermal interface having a thickness ranging from 0.3 mm to 4 mm, and a secondary fiber thermal interface (FTI) having a first side configured to contact the second side of the primary FTI, a second side configured to contact circuit components to dissipate heat from the circuit components through the first side of the primary FTI, the secondary fiber thermal interface having a thickness equal to or greater than the primary FTI.

In another embodiment, the secondary FTI includes a thickness from 5.0 mm to 30 mm. The TE interface further comprises another primary fiber thermal interface having a first side configured to contact the second side of the secondary FTI and a second side configured to contact circuit components to dissipate heat from the circuit components through the secondary FTI and the first side of the primary FTI.

In yet another embodiment, the secondary FTI includes a compressible material such as shape memory polymers, metal wool, metal mesh, rigid or soft metal foams, fuzz buttons, honeycomb structures, miniature bellows.

In another embodiment, the compressible material includes a Z-axis profile to retain a springing action when sandwiched between the primary FTI and the another primary FTI.

Additional aspects, configurations, features, and embodiments of the present disclosure are described herein to aid in the understanding of the present disclosure.

Figure 1:
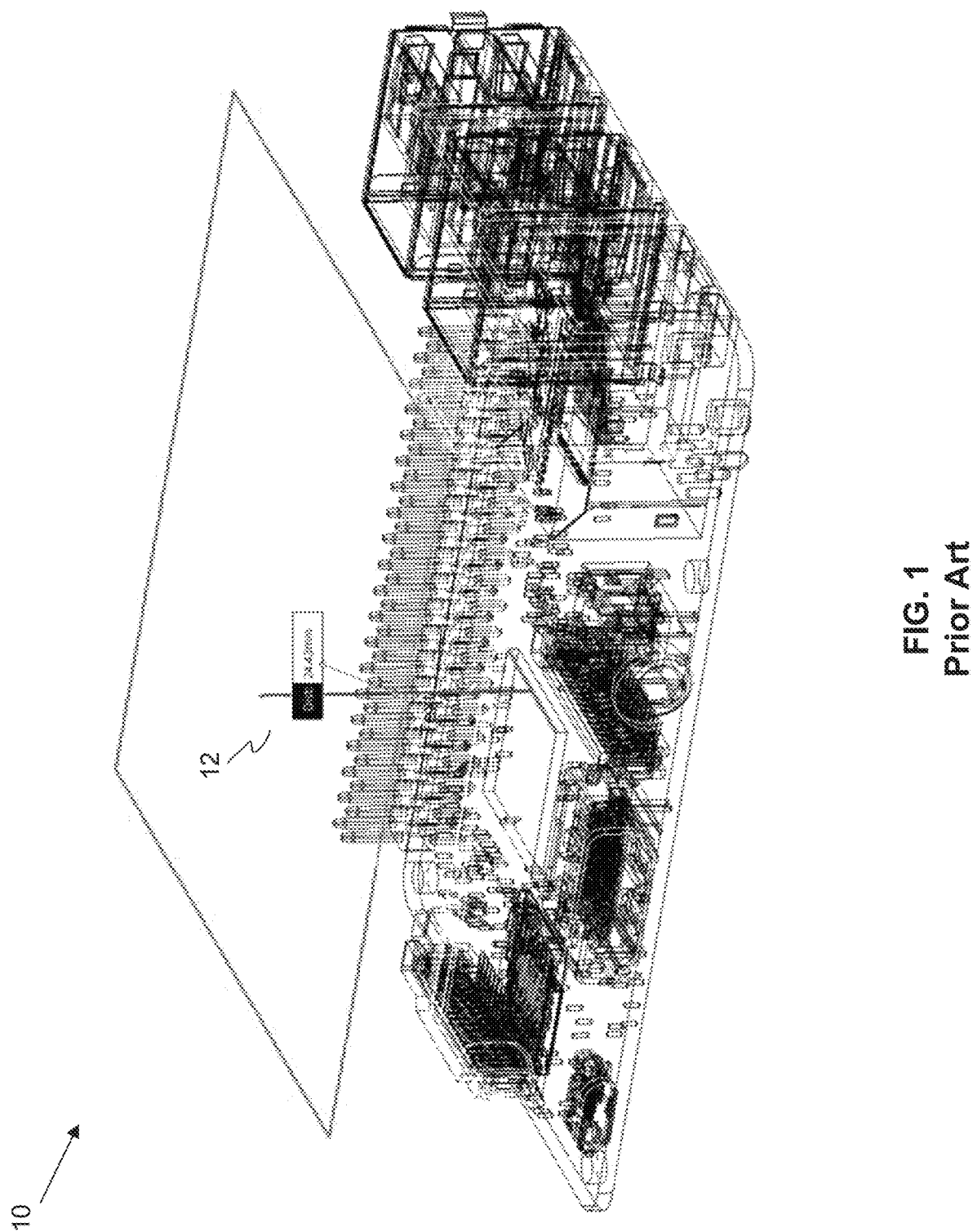
FIG. 1 illustrates a prior art Raspberry Pi3 Model B case.
Figure 2:
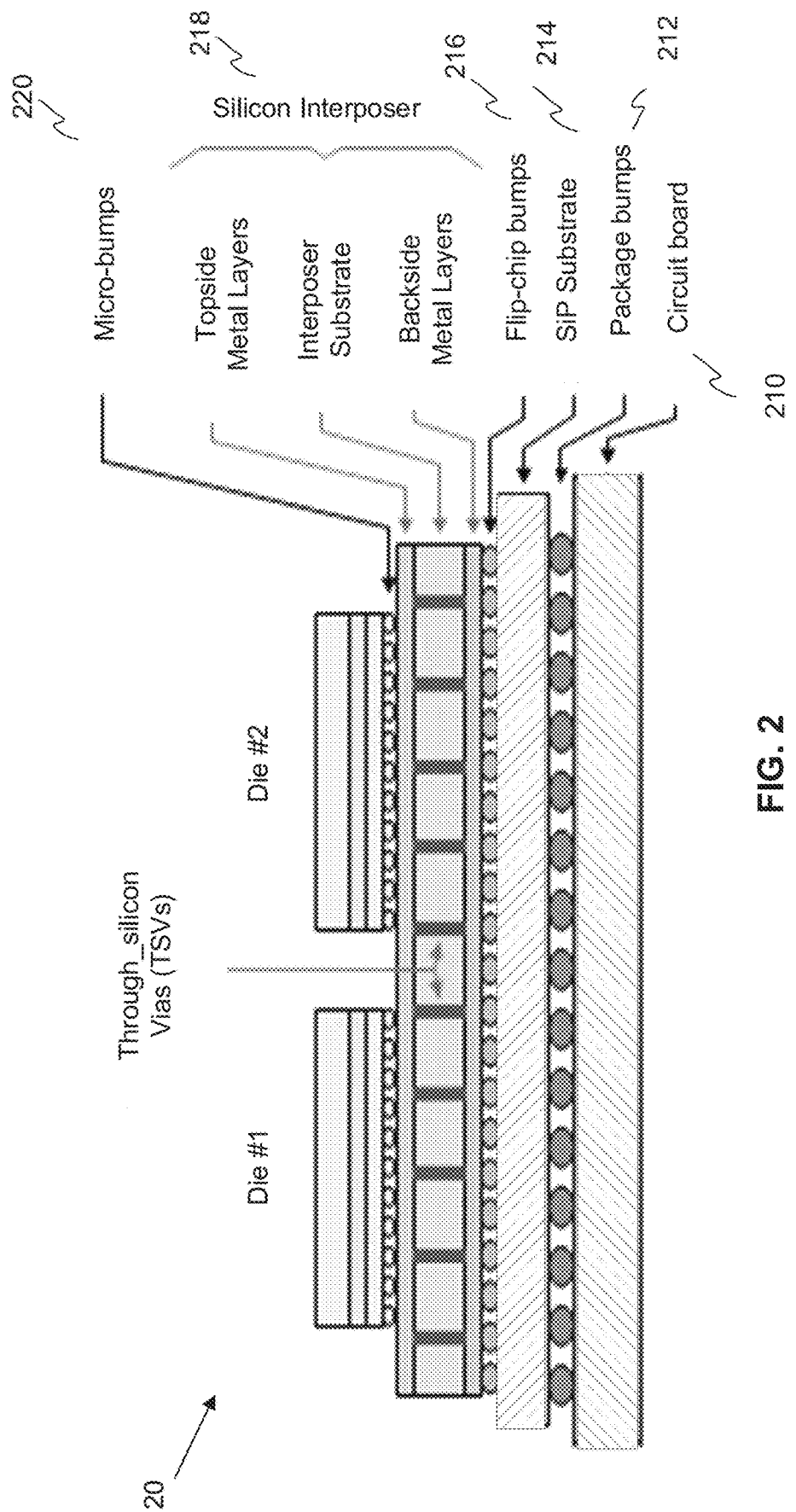
FIG. 2 illustrates a prior art cut-away view of a 2.5D/3DIC SiP (Silicon Package) mounted on a printed circuit board.
Figure 3:
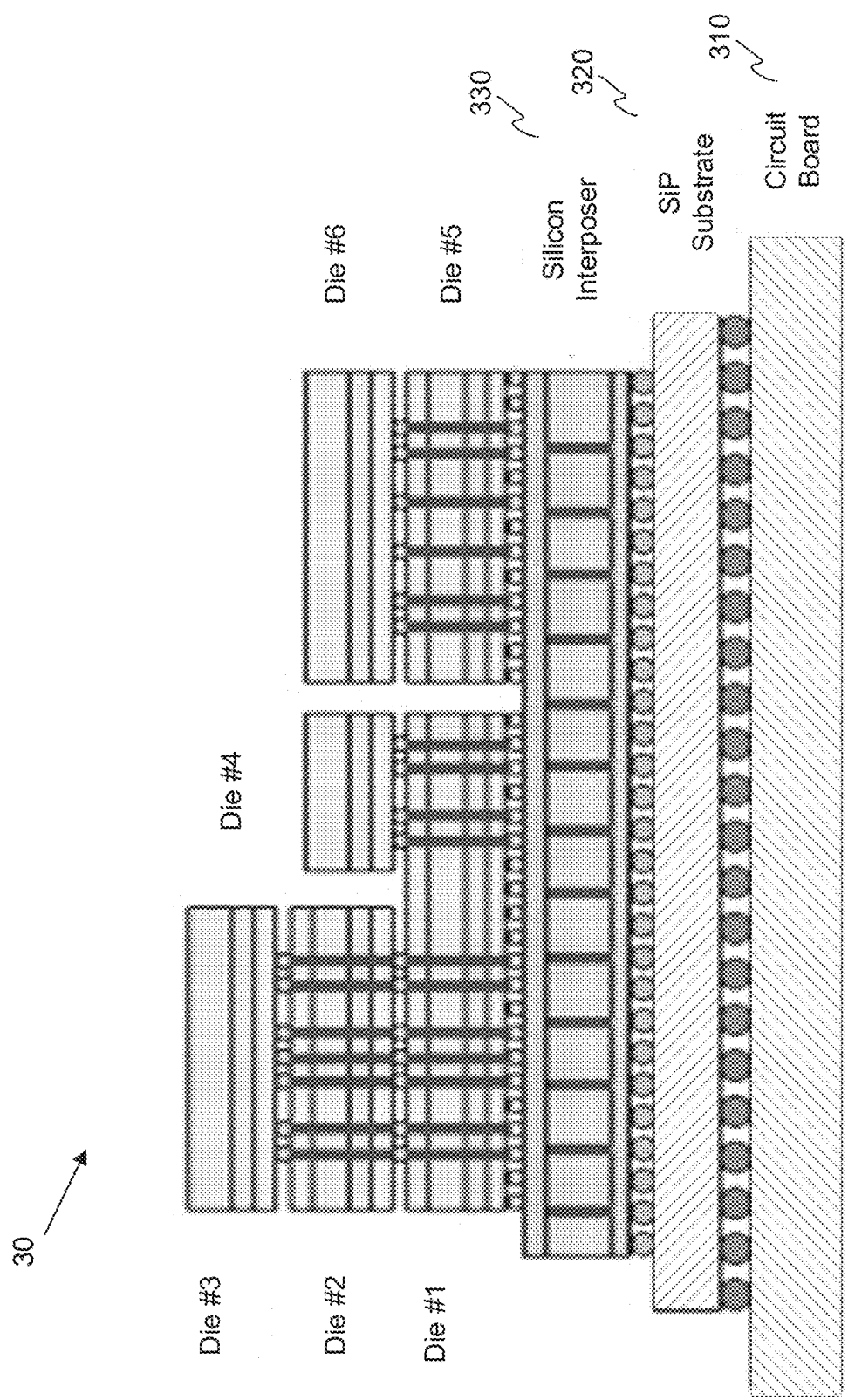
FIG. 3 illustrates a prior art cut-away view of a 2.5D package having a silicon interposer with stacks of varying heights.
Figure 4:
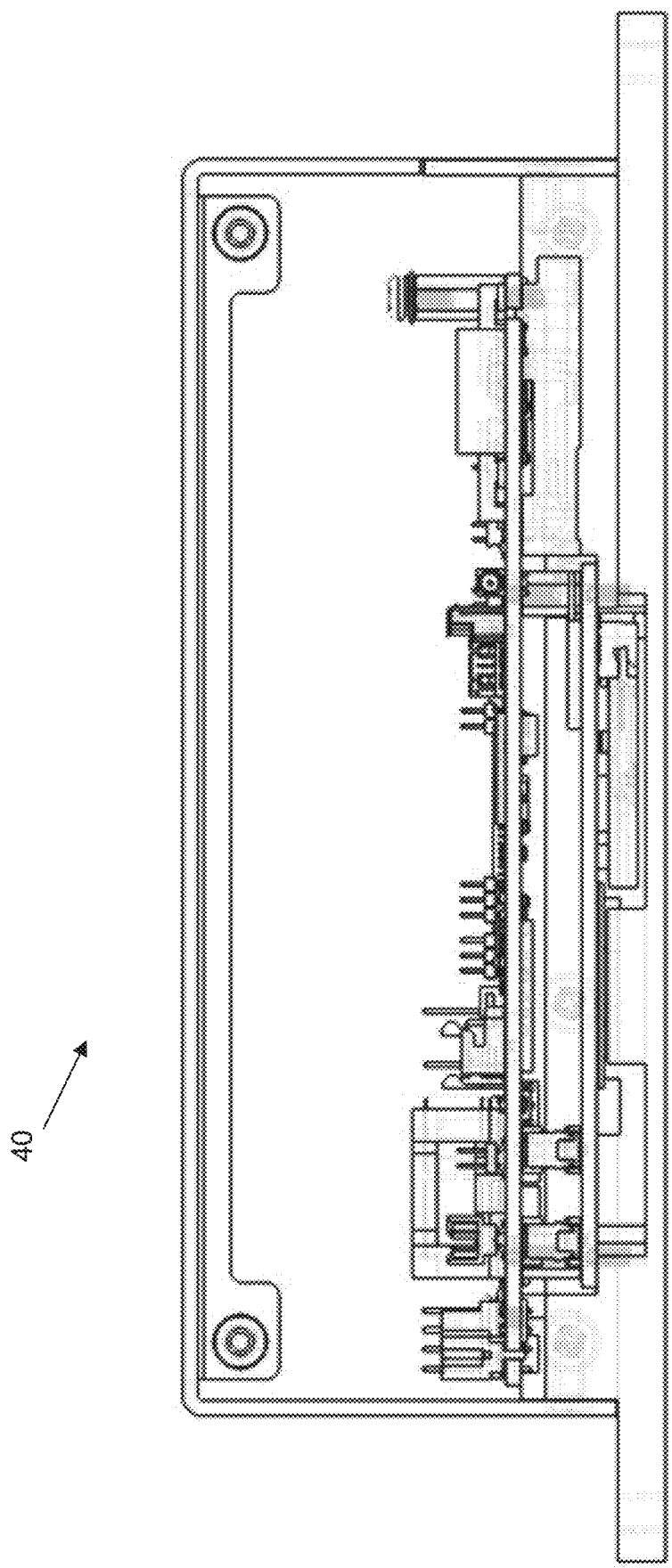
FIG. 4 illustrates a cut out section of a prior art single board computer with various internal components.

FIG. 4 illustrates a cut out section of a prior art single board computer 40 with various internal components. The prior art single board computer may be a fanless or a fan cooled computer.

Figure 5:
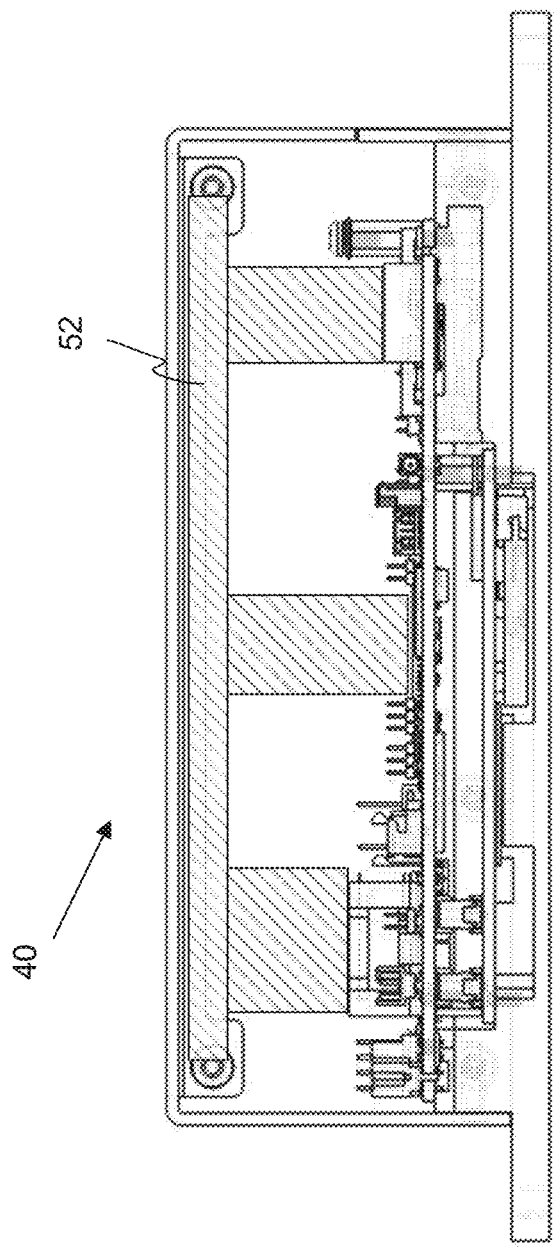
FIG. 5 illustrates a cut out section of the single board computer with various internal components having a thermal electrical (TE) interface attached to certain components of the single board computer in accordance to an embodiment of the present invention.

FIG. 5 illustrates a cut out section of the single board computer 40 with various internal components having a thermal electrical (TE) interface 52 attached to certain components of the single board computer in accordance to an embodiment of the present invention. The cross-hatched areas in the drawing represent the thermal electrical (TE) interface 52 that thermally and/or electrically interface various components of different heights for heat dissipation and/or grounding or electromagnetic interference (EMI) protection.

Figure 6:
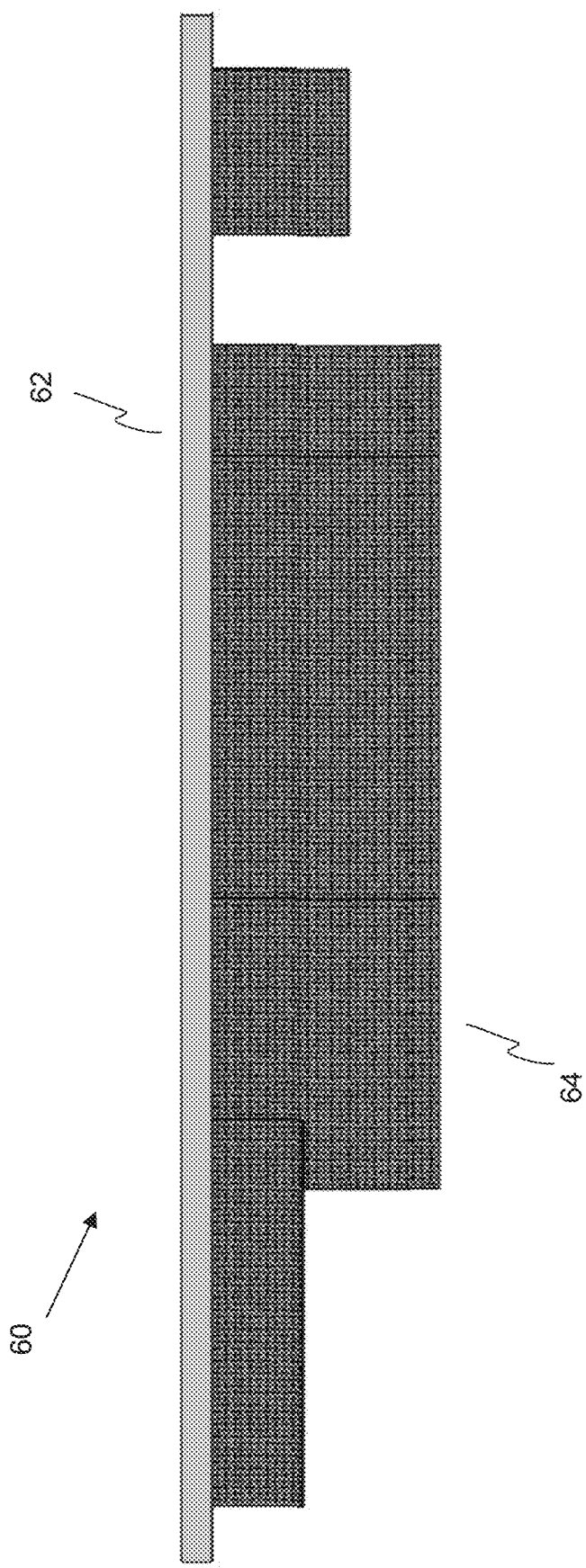
FIG. 6 illustrates a side view of a TE interface in accordance to an embodiment of the present invention.

FIG. 6 illustrates a side view of a TE interface 60 in accordance to an embodiment of the present invention. The TE interface 60 includes a primary FTI 62 (fiber thermal interface) or primary TIM (thermal interface material) and a secondary FTI 64 or secondary TIM. The primary FTI 62 interfaces to the outside environment via a heatsink, cover, cold plate, case, enclosure, etc. The primary FTI 62 can be electrically conductive completely or partially if needed for EMI grounding purposes. The secondary FTI 64 interfaces to the primary FTI 62 on one side and to a heat dissipating component on the other side. In accordance to an embodiment of the present invention, the secondary FTI 64 can also interface with a side wall of an enclosure to increase surface area for improved heat dissipation. The secondary FTI 64 can be implemented using a standard thickness FTI ranging from 0.3 mm to 4 mm or a large gap hybrid FTI ranging from 6 mm to 30 mm. Both implementations of the secondary FTI 64 can be electrically conductive or insulating.

Figure 7:
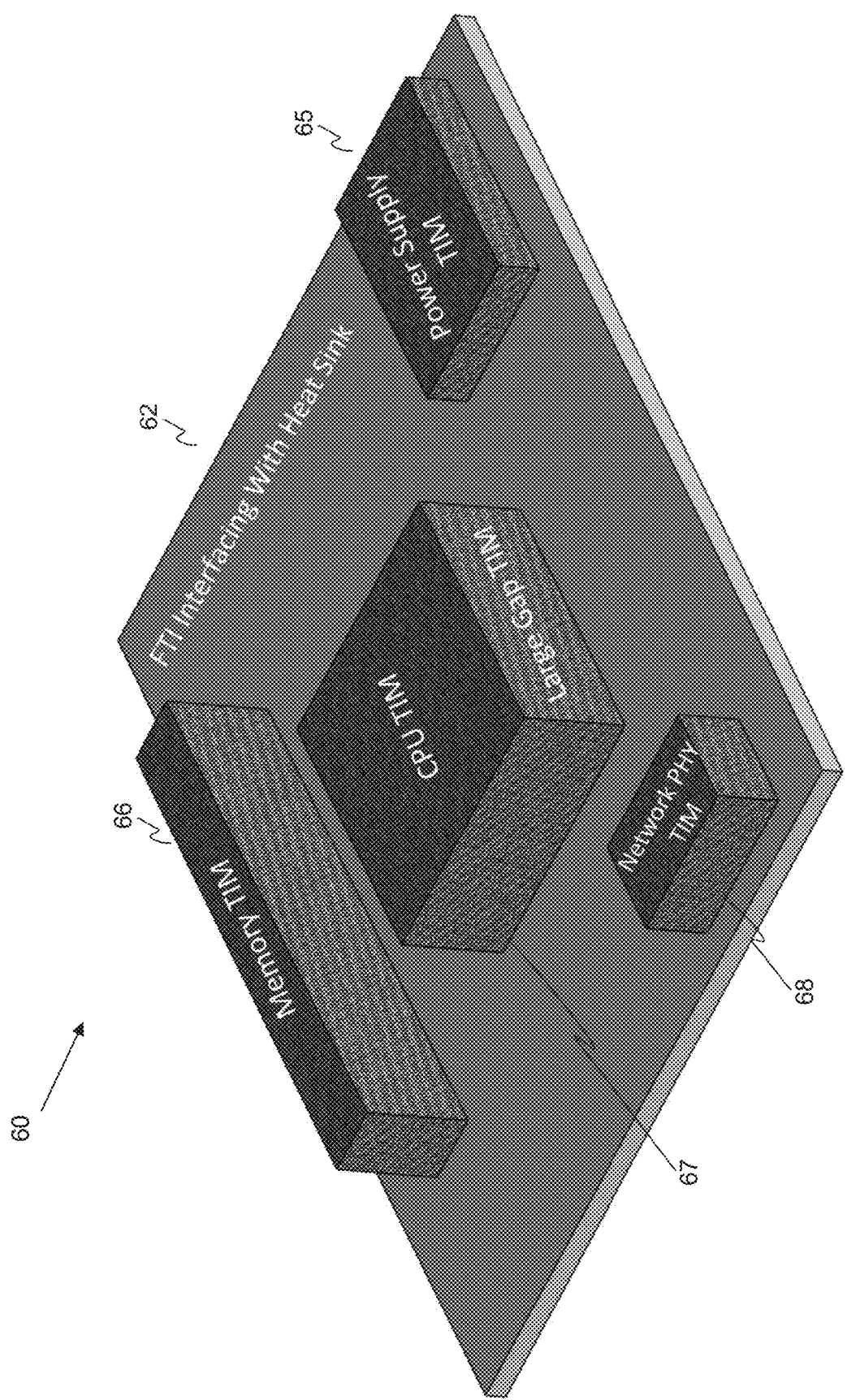
FIG. 7 illustrates an isometric view of the TE interface in accordance to an embodiment of the present invention.

FIG. 7 illustrates an isometric view of the TE interface 60 in accordance to an embodiment of the present invention. The primary FTI 62 or primary TIM is shown as the base to better illustrate the placement of a power supply TIM 65, a memory TIM 66, a CPU TIM 67, and a network PHY TIM 68. Accordingly, the secondary FTI 64 includes the power supply TIM 65, the memory TIM 66, the CPU TIM 67, and the network PHY TIM 68.

Figure 8:
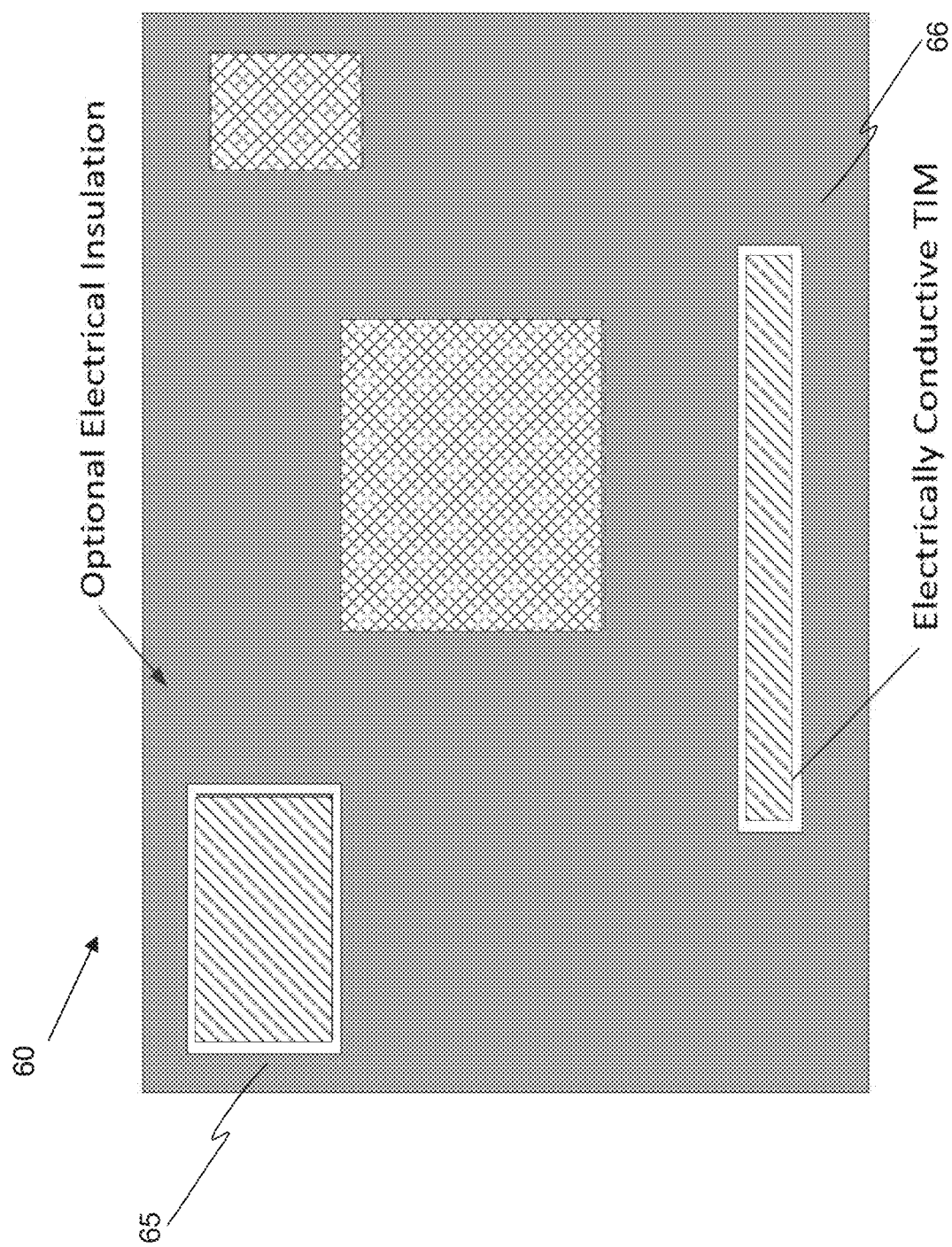
FIG. 8 illustrates a top view of the TE interface with selective grounding and insulation in accordance to an embodiment of the present invention.

FIG. 8 illustrates a top view of the TE interface 60 with selective grounding and insulation in accordance to an embodiment of the present invention. The TE interface 60 is generally configured to be electrically non-conductive. However, the power supply TIM 65 and the memory TIM 66 include an electrically conductive TIM. The electrically conductive TIMs of the power supply TIM 65 and the memory TIM 66 are illustrated with highlighted border to indicate conductivity. The conductive version of the TIMs has the ability to provide electromagnetic shielding of the interfaced component and may require some extension to attach the TIM to a ground for certain applications.

Material choices for the TE interface include solid thermal interface that can be manufactured in the specified shape and thickness for small gaps from 0.3 mm to 4.0 mm or large gaps from 5.0 mm to 30 mm. For small gaps from 0.3 mm to 4.0 mm, compressible core materials such as carbon fibers are often used. Other compressible core materials can include shape memory polymers, metal wool, metal mesh, rigid or soft metal foams, fuzz buttons, honeycomb structures, or individual or ensemble of miniature bellows made of metal, composites, etc.

Figure 9:
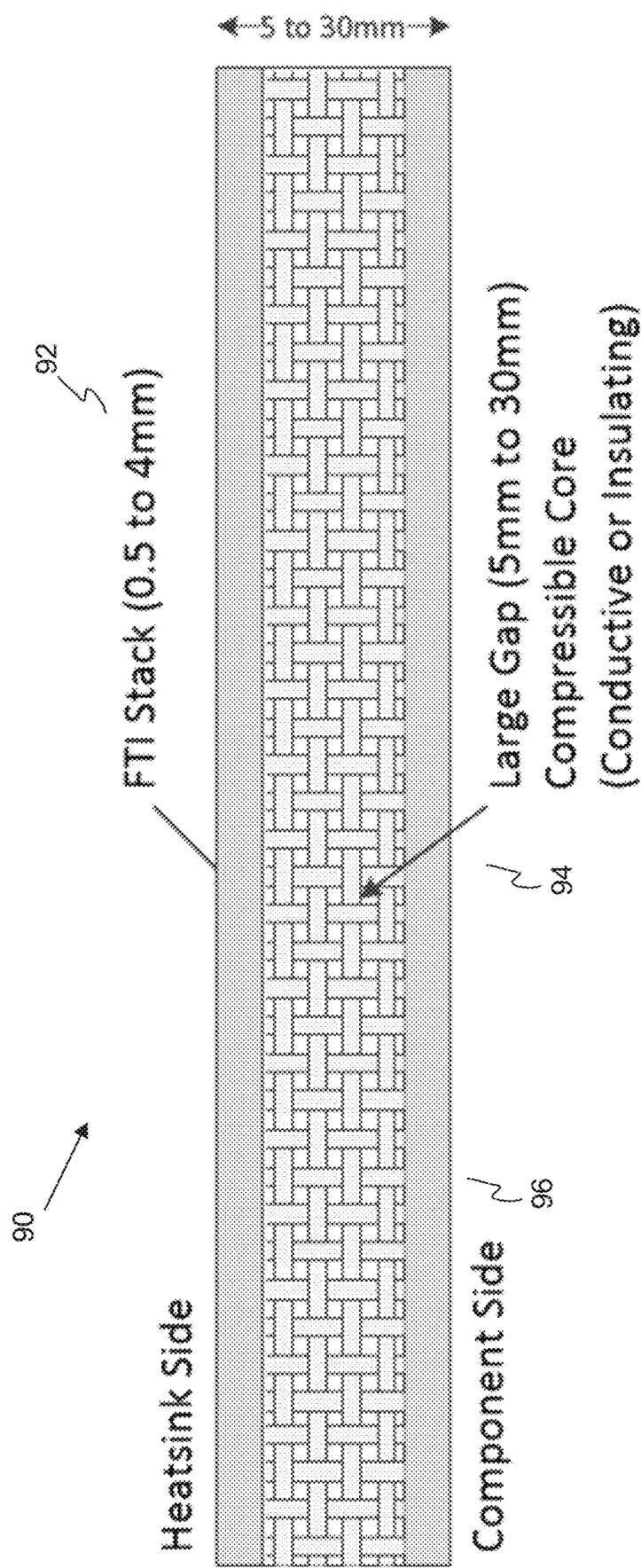
FIG. 9 illustrates a TE interface or hybrid FTI (fiber thermal interface) in accordance to an embodiment of the present invention.

FIG. 9 illustrates a TE interface or hybrid FTI (fiber thermal interface) 90 in accordance to an embodiment of the present invention. The hybrid FTI 90 addresses interface gaps larger than 5 mm and curved, non-flat surfaces separated by a gap distance. Although the present nomenclature is hybrid FTI, alternate nomenclatures such as Large Gap FTI, Large Gap Thermal Pad, Large Gap TIM are also appropriate. The hybrid FTI 90 includes an FTI stack 92, a compressible core 94 of appropriate thickness stacked and bonded together, and another FTI stack 96. In accordance to the present invention, the compressible core 94 can range from 5 mm to 30 mm in thickness. In general, the hybrid FTI 90 comprises a first FTI stack 92 and a second FTI stack 96 sandwiching the compressible core 94 in between. It should be noted that the compressible core 94 can include either electrically conductive or electrically insulative properties but generally, the compressible core 94 features good thermal conductivity. Although the compressible core 94 can include larger thicknesses beyond 25 mm, the thermal advantage of larger thicknesses may not be as desirable.

Figure 10:
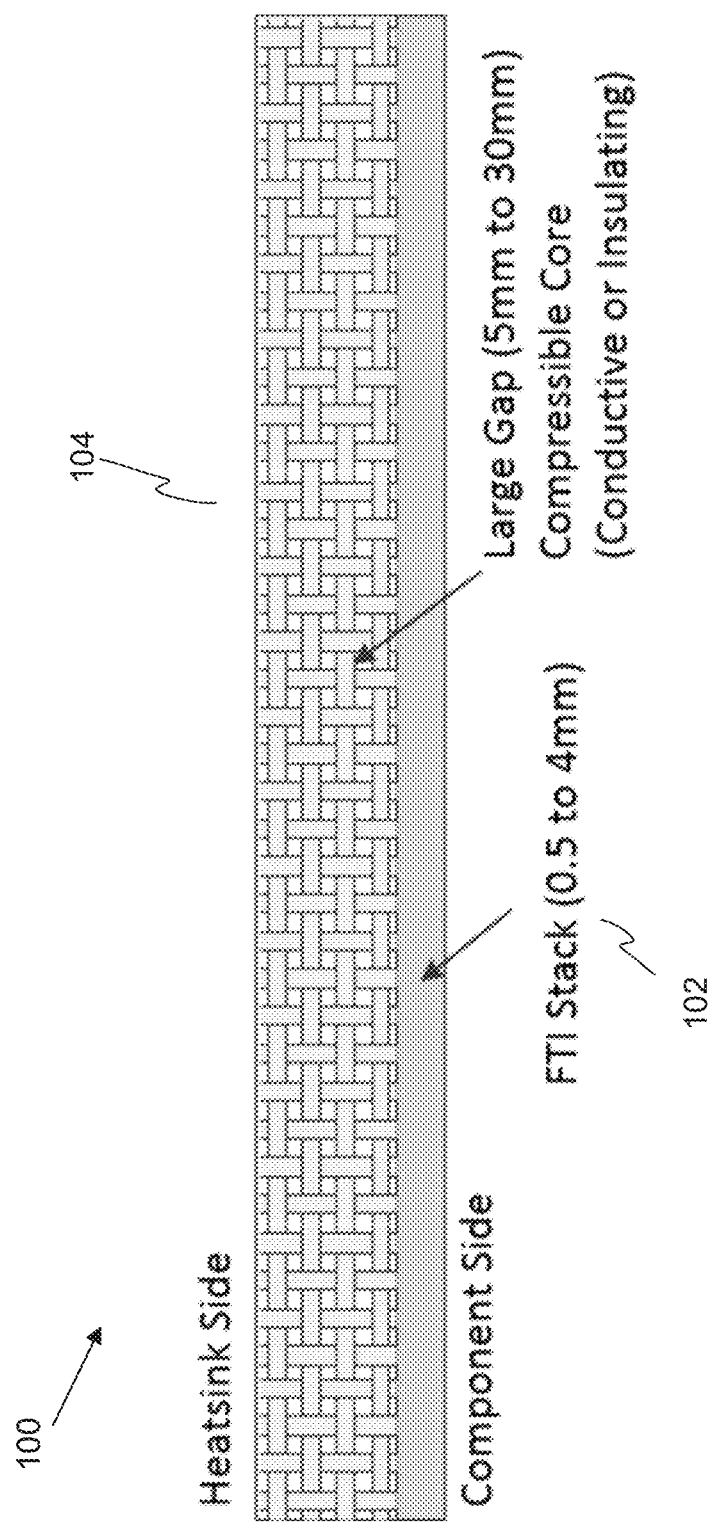
FIG. 10 illustrates an alternative embodiment of the hybrid FTI stack having a single-sided FTI.

FIG. 10 illustrates an alternative embodiment of the hybrid FTI stack having a single-sided FTI 100. The single-sided FTI 100 includes an FTI stack 102 and a compressible core 104. Depending on the material property of the FTI stack 102, the stack can include insulating or conductive properties. For example, the FTI stack 102 can be used for thermal and electrical interfacing between chip components and ground plane or heat sink. In applications for electrically insulating and thermal interfacing, a conductive or insulating large gap core with insulating FTI on both sides or on one side can be used.

Figure 11:
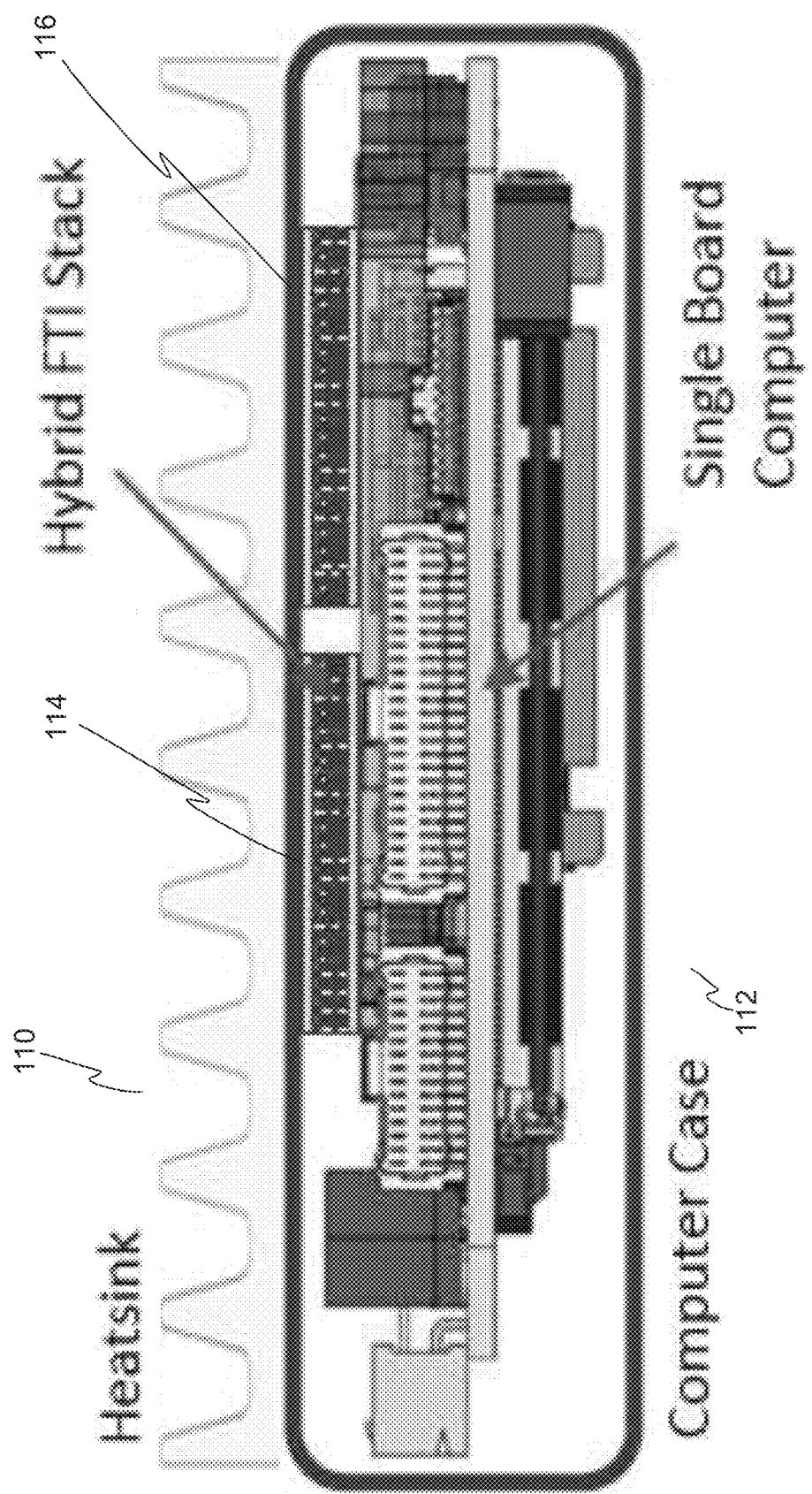
FIG. 11 illustrates a hybrid FTI thermally interfacing to another heatsink mounted on the computer case of a Mini-ITX single board computer.

FIG. 11 illustrates a hybrid FTI thermally interfacing to another heatsink mounted on the computer case of a Mini-ITX single board computer. The another or exterior heatsink 110 is attached to the computer case 112 which is typically made of metal in the present example. Two Hybrid FTI stacks 114, 116 are used to provide a thermal interface between components of the Mini-ITX single board computer and the exterior heatsink 110. The two hybrid FTI stacks 114, 116 are compressed to provide snug interfacing contact between the components of the Mini-ITX single board computer and the metal cover interfacing to the external heatsink.

There are many choices of materials that can be used for the compressible core of the hybrid FTI stacks. Depending on design constraints, an electrically conductive interface or an insulative interface can be achieved. Accordingly, the following material choices are used in the present disclosure, the materials disclosed are by no means intended to be limited to the material choices discussed herein.

Shape memory polymers (SMPs) include porous as well as solid non-metal shape memory polymers that can have insulative properties or conductive properties with metal particle infusion. Examples include materials such as polyurethane, metal-filled poly, butylene succinate foam, and other similar propertied materials. The materials can be thermally actuated or thermally inert. Moreover, the materials can be single or dual shape memory-capable e.g. materials capable of two shapes: a temporary shape and one permanent shape. The SMP includes properties that can absorb energy from vibration that otherwise can lead to accumulation of damaging stress to the components. Also, SMPs can be stored in compressed states for long periods of time with no effect on shape memory. In accordance to an embodiment of the present invention, plain polymers as well as metal infused polymers are used for the compressible core of the hybrid FTI stacks.

Figure 12:
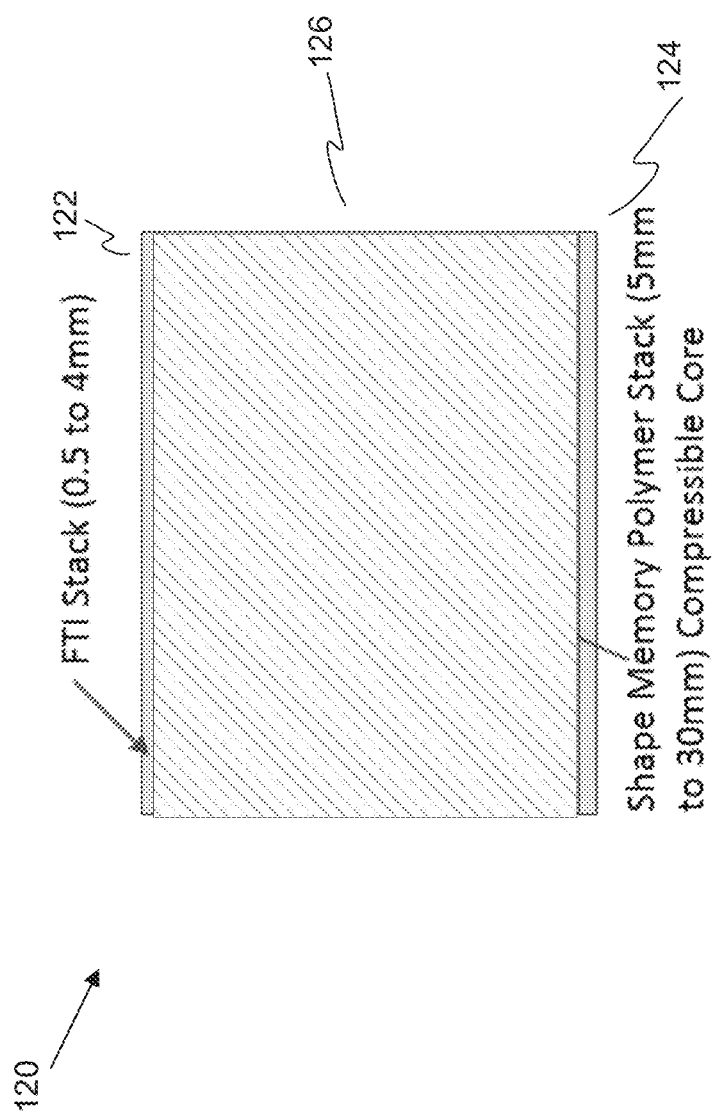
FIG. 12 illustrates a hybrid FTI stack with a shape memory polymer stack in accordance to an embodiment of the present invention.

FIG. 12 illustrates a hybrid FTI stack 120 with a shape memory polymer stack in accordance to an embodiment of the present invention. The hybrid FTI stack 120 includes a first primary FTI stack 122, a second primary FTI stack 124, and a shape memory polymer (SMP) stack or compressible core 126 sandwiched between the first primary FTI stack 122 and the second primary FTI stack 124. In accordance to an embodiment of the present invention, the primary FTI stack 122, 124 has a thickness of 0.5 mm to 4 mm, and the SMP stack 126 has a thickness of 5 mm to 30 mm. Material choices for the SMP stack 126 include porous as well as solid non-metal shape memory polymers that are insulating or conductive with metal particle infusion. Examples materials include polyurethane, metal-filled poly, butylene succinate foam, and similar. The materials can be single or dual shape memory-capable. The SMP can absorb energy from vibration that can cause damage accumulation in a component. The SMP foams can be stored in compressed states for long periods of time with no effect on later shape recovery. In accordance to embodiments of the present invention, both plain polymers as well as metal infused polymers are used for the SMP stack 126.

Figure 13:
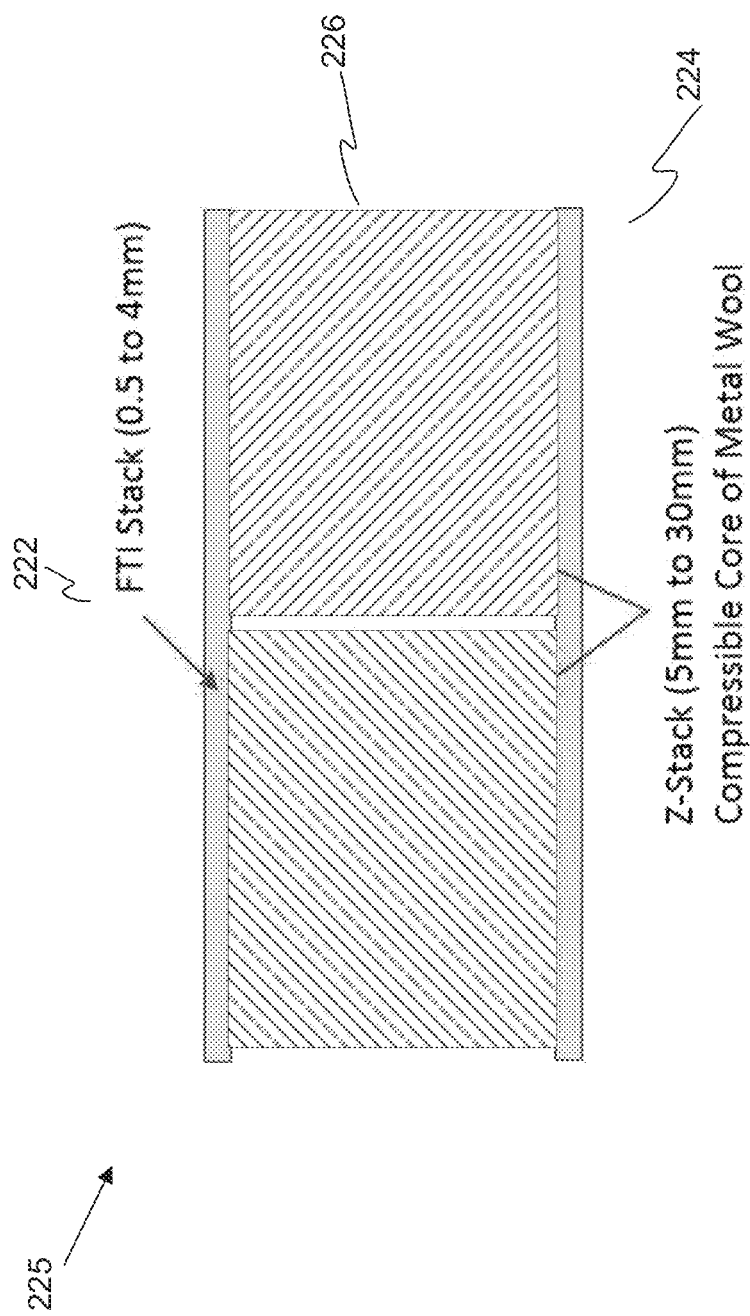
FIG. 13 illustrates a hybrid FTI stack with a shape memory polymer stack with metal wool in accordance to an embodiment of the present invention.

FIG. 13 illustrates a hybrid FTI stack 225 with a shape memory polymer stack with metal wool in accordance to an embodiment of the present invention. The hybrid FTI stack 225 includes a first primary FTI stack 222, a second primary stack 224, and a shape memory polymer (SMP) stack 226 sandwiched between the first primary FTI stack 222 and the second primary FTI stack 224. In accordance to an embodiment of the present invention, the primary FTI stack 222, 224 has a thickness of 0.5 mm to 4 mm, and the SMP stack 226 has a thickness of 5 mm to 30 mm. The SMP stack 226 includes precision metal wool components that are compressible and retain their shape memory properties when pressure is removed. The metal wool components are ideal for large and small gaps. In accordance to the present embodiment, the metal wool components can include copper wool or steel wool fabricated and formed to a specified shape including rectangular cross sections commonly encountered in electronic industry. The rectangular cross section of the metal wool components includes a Z-axis vertical profile or Z-stack to retain a springing action.

Figure 14:
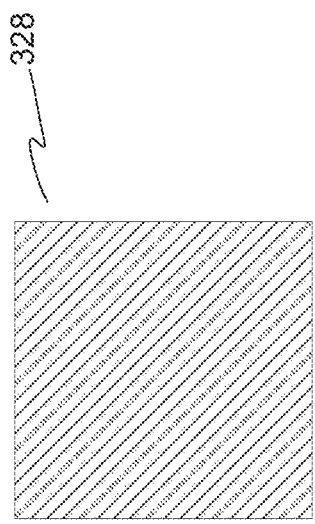
FIG. 14 illustrates a copper metal mesh and a steel metal mesh for use as a compressible core sandwiched between the primary FTI stacks in accordance to an embodiment of the present invention.
Figure 14:
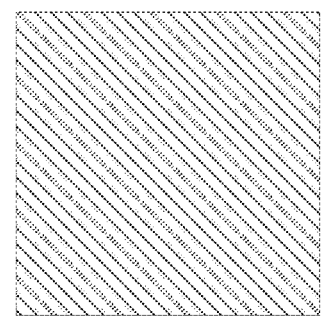

FIG. 14 illustrates a copper metal mesh 326 and a steel metal mesh 328 for use as a compressible core sandwiched between the primary FTI stacks in accordance to an embodiment of the present invention. The copper metal mesh 326 and the steel metal mesh 328 are wire meshes in standard wire sizes. The wire meshes are cut and formed to provide a Z-axis vertical profile to retain a springing action.

Figure 15:
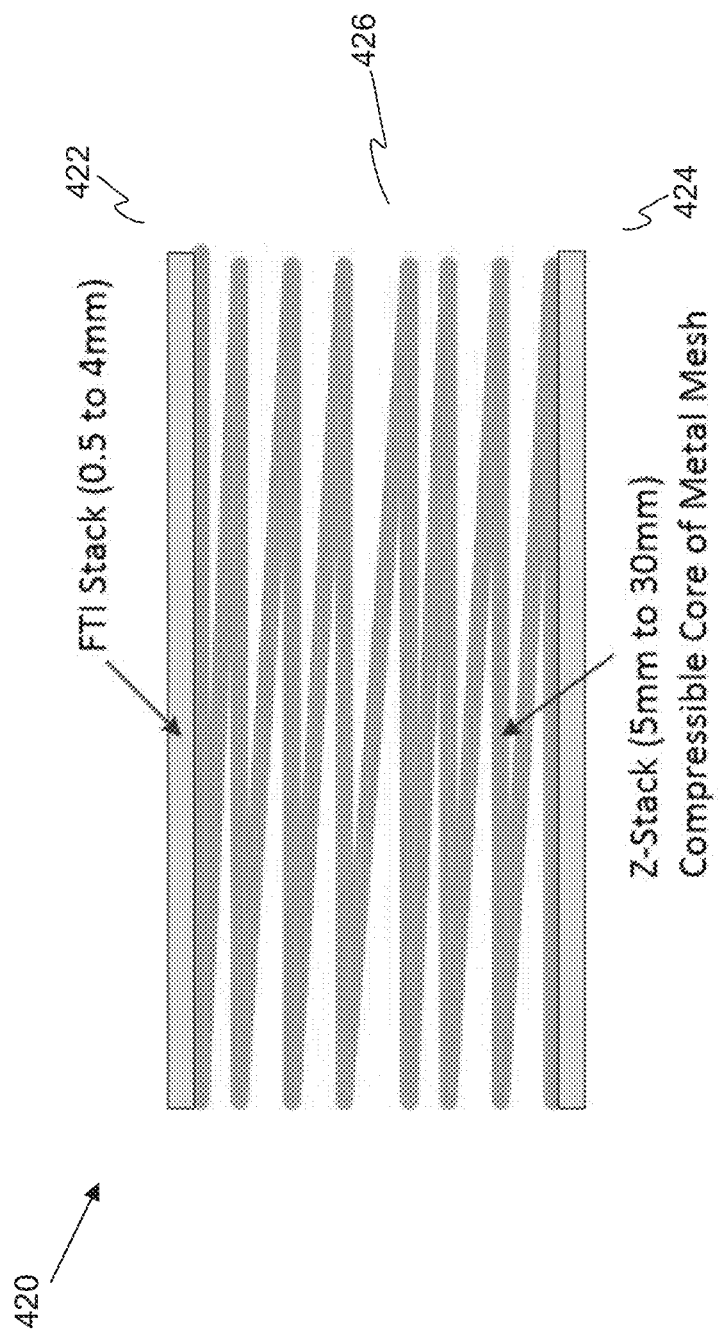
FIG. 15 illustrates a hybrid FTI stack with a metal mesh stack having a Z-axis vertical profile or Z-stack in accordance to an embodiment of the present invention.

FIG. 15 illustrates a hybrid FTI stack 420 with a metal mesh stack having a Z-axis vertical profile or Z-stack in accordance to an embodiment of the present invention. The hybrid FTI stack 420 includes a first primary FTI stack 422, a second primary stack 424, and a metal mesh stack 426 sandwiched between the first primary FTI stack 422 and the second primary FTI stack 424. The metal mesh stack 420 is folded and includes a Z-axis vertical profile or Z-stack to retain a springing action when sandwiched between the first primary FTI stack 422 and the second primary FTI stack 424.

In accordance to another embodiment of the present invention, fuzz Buttons® are used as a compressible core sandwiched between the first primary FTI stack and the second primary FTI stack. Fuzz Buttons® resemble cylinders, slugs, discs, doughnuts and washers, and are used often used in the electronics test industry in test sockets as contactors. These are typically utilized for specialized EMI Shielding and/or for compliant high current capable ground pads. Fuzz Buttons® are simple structures whereby, the signal element and the spring are one and the same. There are no other moving parts that can cause failure or degrade signal integrity. The Fuzz Button® provides precise direct contact and has recoverable compression up to 30%. They are typically manufactured from a long strand of highly specialized very fine wire (often as fine as human hair) that offers high levels of conductivity, strength and oxidation resistance. There are several wire material types available, most are gold-plated, primarily for the properties of conductivity and prevention of oxidation.

Figure 16:
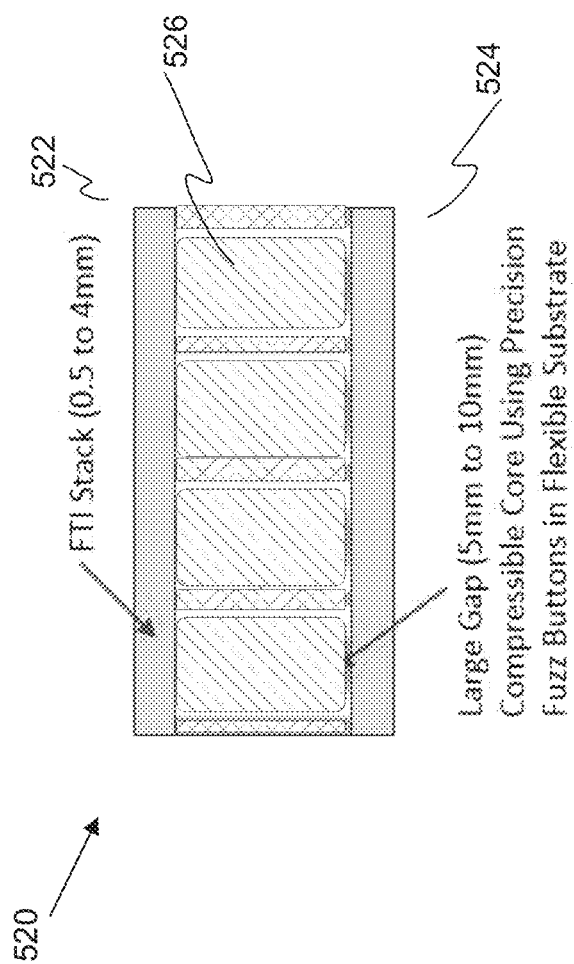
FIG. 16 illustrates a hybrid FTI stack with fuzz Buttons® as a compressible core in accordance to an embodiment of the present invention.

FIG. 16 illustrates a hybrid FTI stack 520 with fuzz Buttons® as a compressible core in accordance to an embodiment of the present invention. The hybrid FTI stack 520 includes a first primary FTI stack 522, a second primary stack 524, and the fuzz buttons 526 sandwiched between the first primary FTI stack 522 and the second primary FTI stack 524. The fuzz Buttons® conduct both heat and electrical power where needed for grounding purposes and are suitable for large gaps from 5 mm to 10 mm. Small walls are erected to separate the fuzz Buttons®. Accordingly, the hybrid stack 520 with fuzz Buttons® as the compressible core has excellent grounding and signal transmission characteristics and are suitable for smaller gaps when used in conjunction with FTI.

Other materials can be used as the compressible core such as rigid and flexible foams of open and closed cell types. These metal foams can include Aluminum, copper, or other suitable shape memory-capable materials. Although typical powder metallurgy materials include copper, aluminum, or other metals, for special applications, ceramic metal foams such as aluminum nitride is used. Powder metallurgy covers a wide range of ways in which materials or components are made from metal powders. The powder metallurgy process avoids, or greatly reduces, the need for later metal removal processes resulting in lower manufacturing costs.

Metal foams are popular in thermal management industry as heat exchanger material. The metal foams can be tailored to various relative densities which determine the resulting thermal conductivity. Thermal conductivity of 8% relative density Al foam is ~6 W/m-K, for example. Open-cell foams have large accessible surface area and high cell-wall conduction giving exceptional heat transfer ability.

Figure 17:
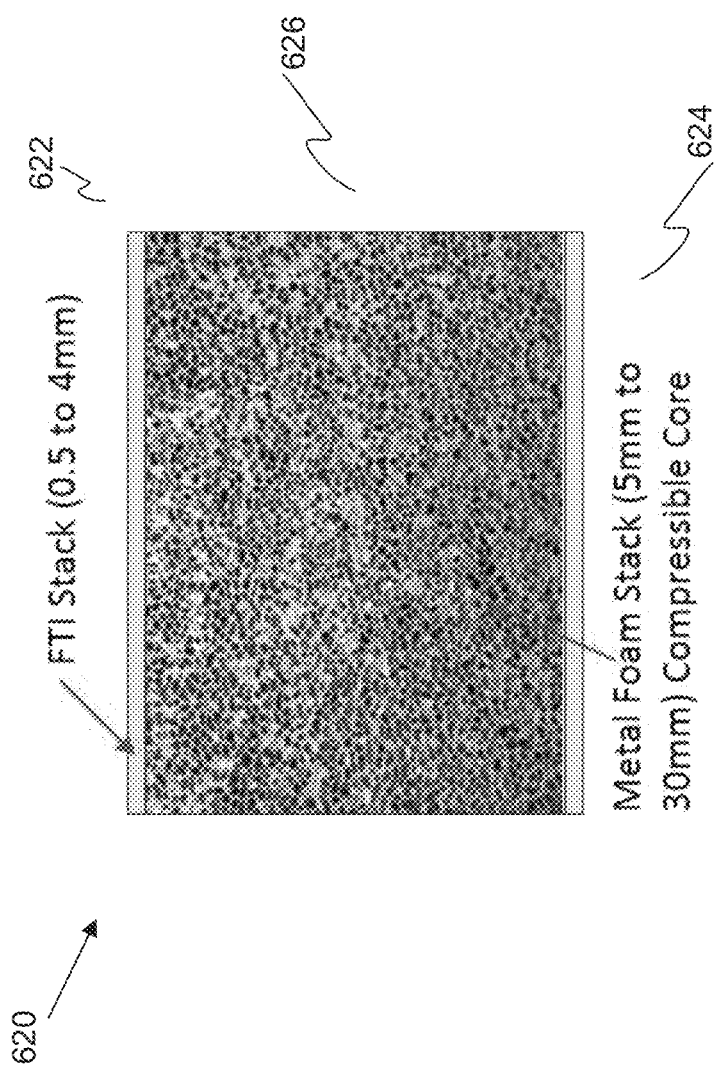
FIG. 17 illustrates a hybrid FTI stack with a metal foam stack in accordance to an embodiment of the present invention.

FIG. 17 illustrates a hybrid FTI stack 620 with a metal foam stack in accordance to an embodiment of the present invention. The hybrid FTI stack 620 includes a first primary FTI stack 622, a second primary stack 624, and a metal foam stack 626 sandwiched between the first primary FTI stack 622 and the second primary FTI stack 624. In accordance to an embodiment of the present invention, the primary FTI stack 622, 624 has a thickness of 0.5 mm to 4 mm, and the metal foam stack 626 has a thickness of 5 mm to 30 mm.

Figure 18:
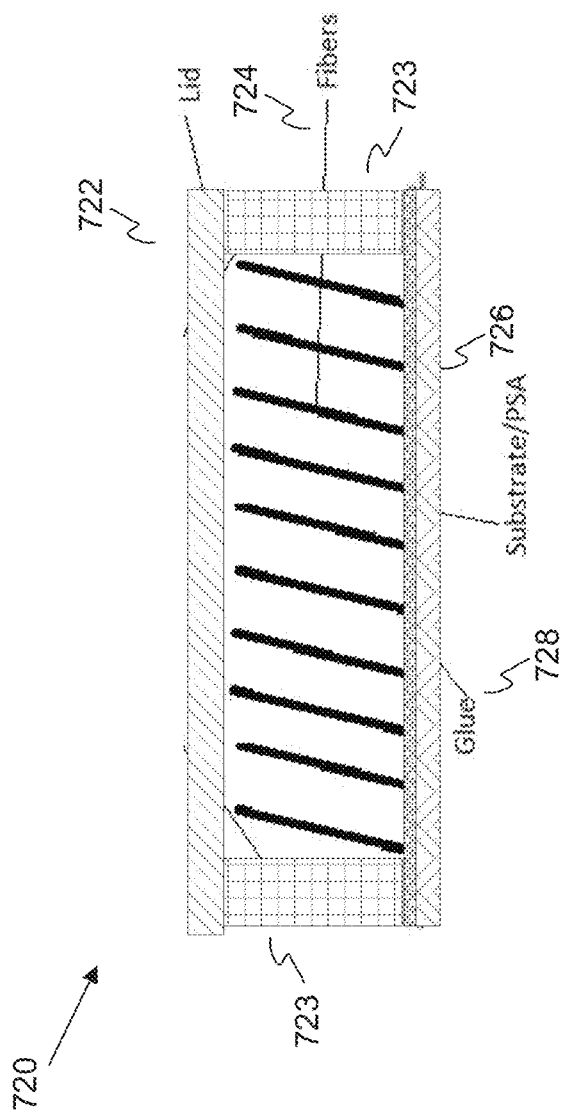
FIG. 18 illustrates a hybrid FTI stack with sliding interface in accordance to an embodiment of the present invention.

FIG. 18 illustrates a hybrid FTI stack 720 with sliding interface in accordance to an embodiment of the present invention. The hybrid FTI stack 720 includes a substrate 726, glue 728, fibers 724, foam borders 723, and a lid 722. The lid 722 can be made of plastic, metal, carbon or any other material that can hold up to sliding operations. The foam 723 can be closed cell or opened cell. Open cell foam is soft like a cushion or the packaging material molded inside a plastic bag to fit a fragile object being shipped. The cell walls, or surfaces of the bubbles, are broken and air fills all of the spaces in the material. Closed cell foam has varying degrees of hardness, depending on its density. A closed cell insulation or flotation polyurethane is between 2 and 3 pounds per cubic foot. It is strong enough to walk on without major distortion. Most of the cells or bubbles in the foam are not broken; they resemble inflated balloons or soccer balls, piled together in a compact configuration that are strong enough to take a lot of pressure. The function of the foam and the lid is to contain the fibers. Thermal greases or liquids are added to the fibers 724 to enhance heat transfer between the fibers and the interface between the fibers 724 and the lid 722. As shown in the FIG. 18, the fibers are slightly canted to provide better compliance. The substrate 726 can include pressure sensitive adhesive (PSA) tape with glue on one side. To further enhance heat spreading properties, the substrate 726 can include a heat spreading material like Pyrolytic Graphite Sheets (PGS) with very thin PSA tape and glue on the other side of the PGS. The PGS is not shown in FIG. 18 to not obscure from the details of the present invention. If the lid 722 is made of plastic, the PSA and the lid are both electrically insulating. There are several options for the lid besides plastic. The lid 722 can be made of metal, carbon or ceramic. It should be noted that PGS can be included between the substrate 726 and the glue layer 728 to enhance thermal conduction.

Figure 19:
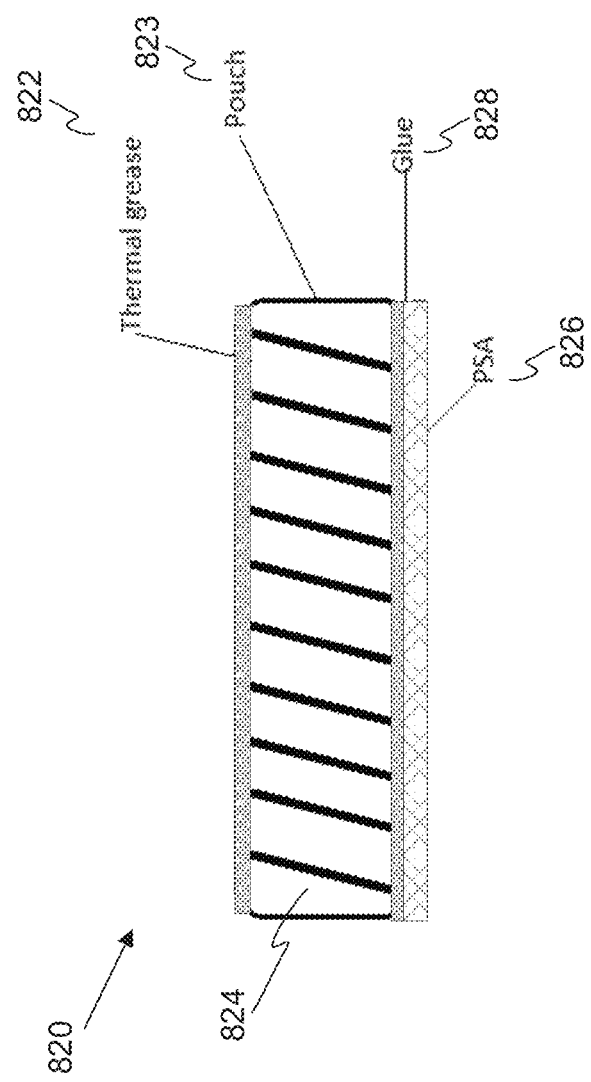
FIG. 19 illustrates a hybrid FTI stack with pouch sliding interface in accordance to an embodiment of the present invention.

FIG. 19 illustrates a hybrid FTI stack 820 with pouch sliding interface in accordance to an embodiment of the present invention. The hybrid FTI stack 820 includes a PSA 826, glue 828, fibers 824, pouch 823, and thermal grease 822. Instead of foam borders and a lid as illustrated in FIG. 18, the fibers are enclosed with a pouch that can be made out of metal, plastic, or carbon. Thermal grease 822 can be added on the inside of the pouch to enhance the thermal performance between the pouch and a surface where the heat gets transferred.

A lot of TIM materials on the market include pressed powder combined with a binder that holds the powder together. A disadvantage of the combined structure is that the particles have to make thermal contact to each other. Even though the powder is made out of thermally high conductive materials, the bulk thermal conductivity is still comparatively low. Under continuous high thermal stress, conductive fibers or fins enhances the bulk material and makes for a higher performing thermal interface with lower contact pressure. A flocked structure can be rigidized or non-rigidized with straight or canted fibers. The compliance can be tailored by how much the fibers are canted. Voids in the fiber structure are filled with electrical isolating or conductive material depending on its application. The filler functions to keep the fibers in place, enhance the heat transfer between the fibers, and reduce the interfacial resistance between the fibers and thermal contact area. Each surface that contacts a thermal interface can have PSA to enhance thermal transfer.

While the present disclosure has been described with reference to certain preferred embodiments or methods, it is to be understood that the present disclosure is not limited to such specific embodiments or methods. Rather, it is the inventor's contention that the disclosure be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A thermal electrical (TE) interface, comprising:
a primary fiber thermal interface (FTI) having a first side configured to contact a heatsink, and a second side;
a secondary fiber thermal interface (FTI) having a first side configured to contact the second side of the primary FTI and a second side of the secondary fiber thermal interface; and
another primary fiber thermal interface having a first side configured to contact the second side of the secondary FTI and a second side configured to contact the circuit component to dissipate heat from the circuit component through the secondary FTI and the primary FTI wherein the secondary FTI includes a thickness from 5.0 mm to 30 mm.

2. A hybrid fiber thermal interface (FTI) stack for dissipating heat between circuit components and a heat sink, comprising:
a pouch enclosure having a plurality of fibers throughout the pouch enclosure having a first end coupled to a first conductive surface using glue and a second end of the fibers coupled to a second conductive surface of the pouch, wherein the first conductive surface of the pouch is coupled to the circuit components to transfer heat from the circuit components to the heat sink.

3. The hybrid fiber thermal interface stack of claim 2, wherein the pouch includes thermal grease configured to couple the second end of the fibers to the second conductive surface of the pouch.

4. The hybrid fiber thermal interface stack of claim 2, wherein the pouch is made of metal, carbon, or ceramic.

5. A method of operating a thermal electrical (TE) interface comprising the steps:
attaching a primary fiber thermal interface (FTI) having a first side configured to contact a heatsink and a second side;
attaching a secondary fiber thermal interface (FTI) having a first side configured to contact the second side of the primary FTI and a second side of the secondary fiber thermal interface; and
attaching another primary fiber thermal interface having a first side configured to contact the second side of the secondary FTI and a second side configured to contact a circuit component wherein the method includes dissipating heat from the circuit component through the another primary fiber thermal interface, the secondary FTI, and the primary FTI.

6. The method of claim 5, wherein the secondary FTI includes a compressible material such as shape memory polymers, metal wool, metal mesh, rigid or soft metal foams, fuzz buttons, honeycomb structures, miniature bellows.

7. The method of claim 6, wherein the compressible material includes a Z-axis profile to retain a springing action when sandwiched between the primary FTI and the another primary FTI.

8. A computer system having a plurality of electronic components inside an enclosure having a thermal electrical (TE) interface, comprising:
a primary fiber thermal interface (FTI) having a first side configured to contact the enclosure, and a second side;
a secondary fiber thermal interface (FTI) having a first side configured to contact the second side of the primary FTI, a second side; and
another primary fiber thermal interface having a first side configured to contact the second side of the secondary FTI and a second side configured to contact circuit components to dissipate heat from the circuit components through the another primary fiber thermal interface, the secondary FTI and the primary FTI.

9. The computer system of claim 8, wherein the secondary FTI includes a compressible material such as shape memory polymers, metal wool, metal mesh, rigid or soft metal foams, fuzz buttons, honeycomb structures, miniature bellows.

10. The computer system of claim 9, wherein the compressible material includes a Z-axis profile to retain a springing action when sandwiched between the primary FTI and the another primary FTI.

\* \* \* \* \*